United States Patent
Liu

(10) Patent No.: US 11,661,653 B2
(45) Date of Patent: May 30, 2023

(54) VAPOR DELIVERY SYSTEMS FOR SOLID AND LIQUID MATERIALS

(71) Applicant: L'Air Liquide, Société Anonyme pour l'Etude et l'Exploitation des Procédés Georges Claude, Paris (FR)

(72) Inventor: Yumin Liu, San Jose, CA (US)

(73) Assignee: L'Air Liquide, Societe Anonyme Pour L'Etude Et L'Exploitation Des Procedes Georges Claude, Paris (FR)

(*) Notice: Subject to any disclaimer, the term of this patent is extended or adjusted under 35 U.S.C. 154(b) by 430 days.

(21) Appl. No.: 16/718,321

(22) Filed: Dec. 18, 2019

(65) Prior Publication Data

US 2021/0189558 A1 Jun. 24, 2021

(51) Int. Cl.
*C23C 16/448* (2006.01)
*C23C 16/44* (2006.01)

(52) U.S. Cl.
CPC ...... *C23C 16/4481* (2013.01); *C23C 16/4402* (2013.01)

(58) Field of Classification Search
CPC ............ C23C 16/4481; C23C 16/4483; C23C 16/45561; C23C 14/243
See application file for complete search history.

(56) References Cited

U.S. PATENT DOCUMENTS

| | | | |
|---|---|---|---|
| 6,444,038 B1 | 9/2002 | Rangarajan et al. | |
| 8,986,456 B2 | 3/2015 | Fondurulia et al. | |
| 9,593,416 B2 | 3/2017 | Fondurulia et al. | |
| 2006/0112882 A1 | 6/2006 | Suzuki et al. | |
| 2006/0121198 A1* | 6/2006 | Shenai-Khatkhate | C23C 16/4481 427/255.28 |
| 2006/0185597 A1 | 8/2006 | Suzuki et al. | |
| 2008/0202426 A1* | 8/2008 | Suzuki | C23C 16/4481 118/726 |
| 2009/0211525 A1 | 8/2009 | Sarigiannis et al. | |
| 2010/0006033 A1 | 1/2010 | Tanaka | |

(Continued)

FOREIGN PATENT DOCUMENTS

| | | |
|---|---|---|
| EP | 0 714 999 | 6/1996 |
| WO | WO 2006 057710 | 6/2006 |
| WO | WO 2007 095407 | 8/2007 |

OTHER PUBLICATIONS

International Search Report and Written Opinion for corresponding PCT/US2020/065336, dated Mar. 16, 2021.

*Primary Examiner* — Aiden Lee
(74) *Attorney, Agent, or Firm* — Yan Jiang

(57) ABSTRACT

Disclosed are vapor delivery systems comprise a housing body defining an interior volume therein, a plurality of flow resistors for receiving a carrier gas, to generate gas distribution lines in the interior volume, at least two surfaces having the solid or liquid precursor applied thereto to allow passage of the carrier gas thereover along the gas distribution lines to mix with a solid or liquid precursor vapor, a gas-collecting device downstream of the gas distribution lines to deliver a mixture of the carrier gas and the solid or liquid precursor vapor out of the system, and a flow controller fluidically connected to a carrier gas source to control a feed flow rate of the carrier gas feeding into the interior volume. A gas distribution flow rate along each gas distribution line is controlled by the feed flow rate of the carrier gas feeding into the interior volume.

12 Claims, 13 Drawing Sheets

(56) References Cited

U.S. PATENT DOCUMENTS

| | | |
|---|---|---|
| 2014/0124064 A1 | 5/2014 | Hidaka et al. |
| 2014/0174955 A1 | 6/2014 | Sasagawa |
| 2015/0167172 A1 | 6/2015 | Woelk et al. |
| 2020/0071848 A1* | 3/2020 | Koukitu .................. C30B 25/08 |

* cited by examiner

VAPOR DELIVERY SYSTEMS FOR SOLID AND LIQUID MATERIALS

FIELD OF THE INVENTION

The present invention relates to apparatus and methods for vaporization and delivery of solid and liquid materials. In particular, the present invention relates to apparatus and methods for vaporization and delivery of solid precursors or solid source precursors or liquid precursors for semiconductor fabrication processes, such as chemical vapor deposition (CVD) and/or atomic layer deposition (ALD) processes.

BACKGROUND

ALD and CVD processes applying solid precursors require reliable solid precursor delivery systems that provide a steady vapor pressure of the solid precursors during the course of the processes. In existing solid precursor delivery devices/vessels, a carrier gas is passed through a heated container containing volatile solid precursor(s) at conditions conducive to vaporization of the solid. The carrier gas mixes with th vaporized solid and the vaporized solid is drawn from a container in a vacuum environment and carried with the carrier gas to a reaction chamber. It is known that solid precursor delivery procedures have been challenging in reliably delivering solid precursor to the reaction chamber. For example, as the solid precursor is vaporized, the heat of vaporization causes heat loss and a temperature drop of underlying solid precursor material. This tends to prevent or limit further vaporization of the underlying solid precursor.

U.S. Pat. Nos. 8,986,456 and 9,593,416 to Fondurulia et al. disclose a device in which a carrier gas flows over a single channel having serpentine groves in a vapor delivery canister, into which a solid is loaded, to bring the vapor produced from the solid to an outlet for constant vapor delivery during the course of the deposition process. Drawbacks of the existing vapor delivery systems may include: i) the single channel is easily clogged by the solid material; ii) between groves there is no seal so that the carrier gas may flow or bypass into other compartments rather than go through the serpentine grove pattern, which changes the stability of the vapor pressure; iii) due to its complicated structure, it is difficult to fill the solid material into the canister and the solid material loading capacity per run is too limited.

US2014/0174955 by Sasagawa discloses a high flow XEF2 canister for gas delivery from solid phase sources in processing systems, in which flow gas used to flow into multiple trays is not controlled.

U.S. Pat. No. 6,444,038 issued to Rangarajan et al. discloses a dual fritted bubbler in which frit (porous glass) are used in the bubbler, but not used in distribute gas flow into multiple channels to control the flow rate.

EP 0714999 by Garenne et al. discloses a method for sublimating a solid material and a device for implementing the method in which two plates of porous materials were applied to the solid material, but not used in distribute gas flow into multiple channels.

Thus, a need remains for designing novel solid vapor delivery systems that may increase material loading capacity per run and are simpler, lighter and less costly than the existing solid vapor delivery systems.

SUMMARY

There is disclosed a vapor delivery system for vaporizing a solid precursor. The disclosed vapor delivery system comprises:

a housing body defining an interior volume therein;
a housing lid comprising a gas inlet and a gas outlet,
a plurality of flow resistors, fluidically connected to the gas inlet, configured and adapted to receive a carrier gas from the gas inlet and generate gas distribution lines in the interior volume;
at least two compartments or channels, contained in a lower portion of the interior volume and having the solid or liquid precursor therein, the at least two compartments or channels configured and adapted to allow passage of the carrier gas thereover along the gas distribution lines to mix with a vapor from the solid or liquid precursor therein;
a gas-collecting device downstream of the at least two compartments or channels, fluidically connected to the gas outlet in the housing lid,
the gas-collecting device configured and adapted to deliver a mixture of the carrier gas and the vapor from the solid or liquid precursor out of the system; and
a flow controller fluidically connected to a carrier gas source, the flow controller being configured and adapted to control a feed flow rate of the carrier gas into the interior volume through the gas inlet,
wherein a gas distribution flow rate of the carrier gas along each gas distribution line is controlled by the feed flow rate of the carrier gas feeding into the gas inlet.

In some embodiments, the disclosed vapor delivery system further comprising baffles on the inner side of the housing lid, the baffles configured and adapted to create a turbulence to make the carrier gas and the vapor from the solid precursor efficiently mixed.

In some embodiments, the baffles are composed of strip-shaped bars on the inner side of the housing lid perpendicular to a flow direction of the carrier gas.

In some embodiments, the side view of the baffles is in a saw-tooth shape, a triangle shape, a sine wave shape, or a side-by-side semi-circle shape.

In some embodiments, the disclosed vapor delivery system further comprises at least two inside walls in the interior volume configured and adapted to separate the interior volume into at least three sections including the first, the second and the third sections.

In some embodiments, each inside wall is fixed on the bottom of the interior volume and the sidewall of the interior volume, and perpendicular to the surface of the bottom and the sidewalls of the interior volume.

In some embodiments, the at least two inside walls are parallel to each other.

In some embodiments, the at least two inside walls are parallel to each other and/or perpendicular to each other.

In some embodiments, the at least two inside walls are flat walls or curved walls.

In some embodiments, the height of the two inside walls is shorter than the height of the sidewall of the interior volume.

In some embodiments, the at least three sections open into a common area forming a single continuous top compartment in the top portion of the interior volume through which the gas distribution lines pass.

In some embodiments, the plurality of flow resistors is placed in the first section.

In some embodiments, the plurality of flow resistors hangs in the first section from the gas inlet in the housing lid.

In some embodiments, the gas-collecting device is placed in the third section.

In some embodiments, the gas-collecting device hangs in the third section from the gas outlet in the housing lid.

In some embodiments, the disclosed vapor delivery system further comprises dividers separating the second section into the at least two compartments or channels.

In some embodiments, each divider is inserted into the at least two inside walls and fixed on the bottom of the interior volume.

In some embodiments, each divider is connected to the at least two inside walls and the bottom of the interior volume at a substantially 90° angle.

In some embodiments, the height of each divider is higher than those of the at least two inside walls so that each divider is able to touch or engage with corresponding structures formed on the inner side of the housing lid once the housing body and the housing lid are assembled.

In some embodiments, an aspect ratio of length versus diameter (or maximum distance across) of the at least two compartments or channels is approximately 10 to 1.

In some embodiments, the diameter of each at least two compartments or channels ranges from ½" to 2" or even larger.

In some embodiments, the plurality of flow resistors and the gas-collecting device are, respectively, a part of the first and the third sections to receive the carrier gas from the gas inlet, generate the gas distribution lines in the interior volume and deliver a mixture of the carrier gas and the vapor from the solid or liquid precursor to the gas outlet.

In some embodiments, the gas-collecting device includes a filter to have the carrier gas and the vapor of the solid or liquid precursor flow through and block solid particles.

In some embodiments, the flow resistors are holes filled with a porous material.

In some embodiments, the porous material within the holes is further contained by a metal element selected from a metal tube, a metal sphere, or a metal plate.

In some embodiments, the flow resistors have an average size ranging from about 1 mm to about 1 cm.

In some embodiments, pores in the porous material have an average pore size of approximately 1 micrometer or less.

In some embodiments, the gas distribution flow rates of the carrier gas along the gas distribution lines are about the same.

In some embodiments, the at least two compartments or channels formed in the interior volume are vertically arranged one above the other.

In some embodiments, a top view of the at least two compartments or channels is in a shape selected from a parallel linear shape, an S-shape or a zigzag shape.

In some embodiments, the gas outlet is fluidically connected to an atomic layer deposition (ALD) chamber or a chemical vapor deposition (CVD) chamber.

In some embodiments the carrier gas is Ne, Ar, Kr, Xe or $N_2$.

In some embodiments, the carrier gas is $N_2$.

In some embodiments, the carrier gas is Ar.

In some embodiments, the flow controller is a mass flow controller.

In some embodiments, the plurality of the flow resistors are placed inside of the housing body.

In some embodiments, the plurality of the flow resistors are placed outside of the housing body.

In some embodiments, the plurality of the flow resistors are placed in the housing lid.

There is disclosed a method for vaporizing and delivering a solid precursor. The method comprises the steps of:

placing the solid or liquid precursor in at least two compartments or channels formed in the bottom portion of an interior volume defined by a housing;

evaporating the solid or liquid precursor to form a vapor from the solid or liquid precursor;

feeding a carrier gas into the interior volume through a porous device placed in the interior volume and fluidically connected to a gas inlet of the housing, wherein the pores in the porous device produce gas distribution lines along which the carrier gas flows and mixes with the vapor from the solid or liquid precursor to form a gas mixture;

adjusting a flow rate of the carrier gas fed to the interior volume, so that a flow of the carrier gas flowing along each gas distribution line is controlled by the flow of the feed carrier gas; and delivering the mixture of the carrier gas and the vapor from the solid or liquid precursor out of the interior volume through a gas-collecting device in the interior volume fluidically connected to a gas outlet of the housing.

In some embodiments, the method further comprises the step of delivering the mixture of the carrier gas and the vapor from the solid or liquid precursor to an ALD or CVD process chamber.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
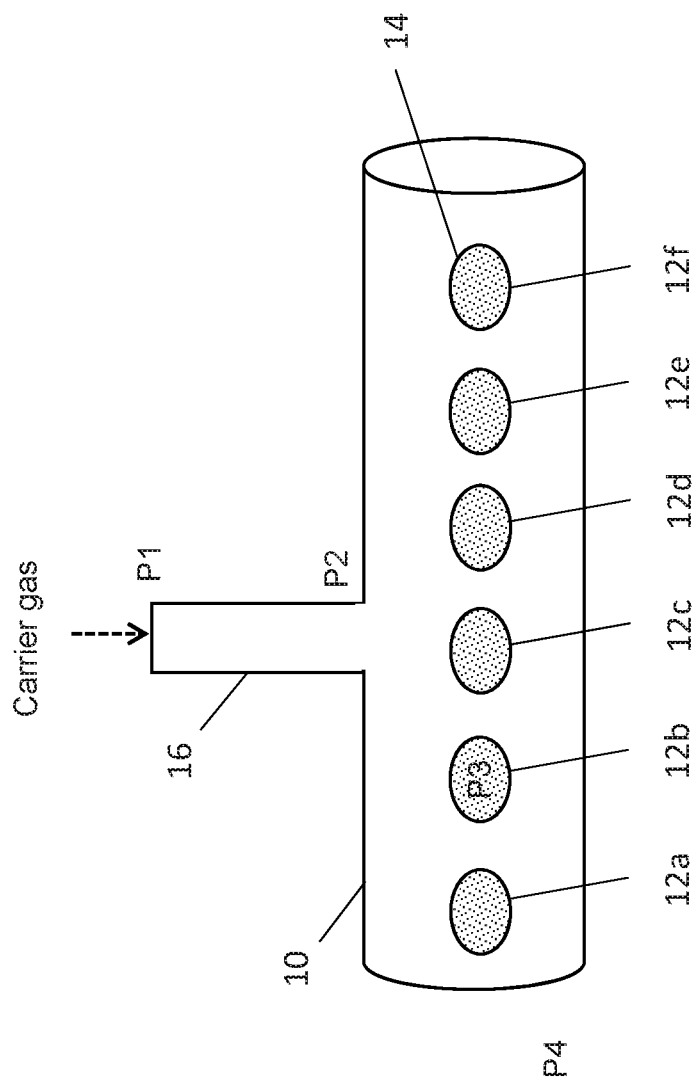
FIG. 1 is a block diagram of an exemplary embodiment of flow resistors made of porous material in a porous metal device fluidically connected to an inlet.

Disclosed are systems and methods for vaporization and delivery of solid and liquid materials to semiconductor fabrication processes, such as chemical vapor deposition (CVD) and/or atomic layer deposition (ALD) processes. In particular, the disclosed relate to apparatus and methods for vaporization and delivery of solid and/or liquid precursors or solid source and/or liquid source precursors for semiconductor fabrication processes. The disclosed vapor delivery systems are capable of stabilizing vapor pressure and providing constant vapor delivery during the course of the deposition process. The disclosed vapor delivery systems utilize porous materials as flow resistors to generate multiple gas distribution lines having uniform flow rates in an interior volume of the system. The porous material fills a plurality of apertures in a metal hollow tube, or sphere, or plate. A carrier gas passes through the plurality of pores, openings, or holes of each flow resistor to get to multiple gas distribution lines (i.e. streams of carrier gas). The size of pores are designed so that it creates a designed pressure drop for the carrier gas across the flow resistors, resulting in flow rates of the carrier gas along all gas distribution lines are approximately the same, or at different but approximately stable flow rate ratios. The flow rates of the carrier gas along all gas distribution lines in the interior volume may be controlled by adjusting a flow rate of the carrier gas fed into the interior volume of the disclosed system. The disclosed vapor delivery systems include multiple channels and provide high flux. The disclosed vapor delivery systems are simplified comparing to the existing vapor delivery systems on the market and may increase solid material loading and decrease cost.

The disclosed vapor delivery systems may be a canister including multiple compartments/channels. The number of the compartments/channels may vary depending on specific requirements of a semiconductor fabrication process. More specifically, the disclosed vapor delivery systems contain multiple small compartments/channels in which the aspect ratio of length versus diameter of each compartment/channel is approximately 10 to 1 ratio and the diameter of each compartment/channel/cylinder may range from ½" to 2" or even larger.

The disclosed vapor delivery systems utilize porous materials as flow resistors to generate pressure drops of a carrier gas and to produce gas distribution lines or flow paths in the canister, thereby producing approximately stable flow rate ratios and preferably approximately uniform flow rates of the carrier gas along the gas distribution lines in the canister. The porous materials have pores having a pore diameter preferably around 1 micrometer or less. The orifices having an orifice diameter from around micrometer to several millimeters (e.g., calibrated orifices, restrictive flow orifices), or capillary tubes having a tube diameter around several millimeters or less can provide a similar pressure drop. The porous material fills holes in a metal tube, sphere, plate, or any shape suitable to be placed in the canister. In this way, the flow rate of the carrier gas along the multiple gas distribution lines may be adjusted by controlling a flow rate of the carrier gas fed into the system. One flow controller, such as a mass flow controller (MFC), may be used to adjust the flow rate of the fed carrier gas. Thus, only one MFC may be used to control the flow rate of the carrier gas along all gas distribution lines in the canister.

The disclosed vapor delivery systems include a gas distribution cap or lid attached to the body of the vapor delivery system. In a specific group of embodiments, the gas distribution lid includes an inlet where at the end of the inlet is a tube perpendicularly connected to the inlet having a length approximately the same as the canister width and approximately 1 to 5 mm in diameter. This inlet tube functions as the flow resistors. The tube may be made of different metal or alloys having holes on it. The porous material fills the holes allowing the carrier gas flowing out of the pores. Pore sizes may range from approximately several nanometers to several millimeters each pore size are approximately even and identical. Preferably, an average pore size is approximately 1 micrometer or less.

Figure 2:
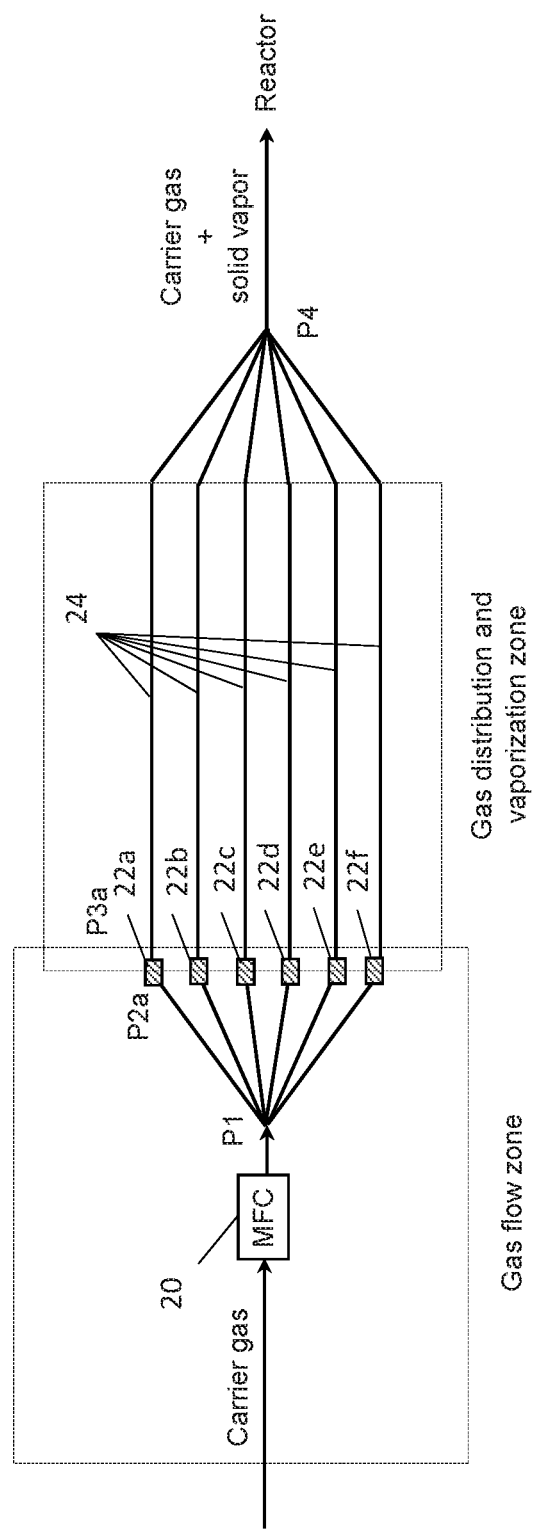
FIG. 2 is a block diagram showing gas flow and distribution lines in the disclosed vapor deliver systems.

FIG. 1 is a diagram of an example of a plurality of flow resistors made of porous material in a porous metal device fluidically connected to an inlet. As shown, the flow resistors $12a$, $12b$, $12c$, $12d$, $12e$ and $12f$ are the holes in a porous metal device 10 fill with the porous material 14. The number of the flow resistors formed in the porous metal device 10 varies. The number of the flow resistors formed in the porous metal device 10 is equal to or larger than 1, preferably 2 or more. The porous metal device 10, made of stainless steel or the like, is fluidically connected to the inlet 16. The holes or the flow resistors $12a$, $12b$, $12c$, $12d$, $12e$ and $12f$ have the same shapes and sizes and are evenly distributed on the enclosed hollow porous metal device 10. The size of the flow resistors $12a$, $12b$, $12c$, $12d$, $12e$ and $12f$ may be in a range of from one millimeters to one centimeter. The porous metal device 10 is an enclosed hollow metal tube having an entrance to fluidically connect to the inlet 16. The metal tube may have a length and diameter of several centimeters. Thus, the carrier gas gets in the porous metal device 10 from the inlet 16 and exits out of the porous metal device 10 through the flow resistors $12a$, $12b$, $12c$, $12d$, $12e$ and $12f$ having the porous material 14 therein. $P_1$ is a pressure of the carrier gas going into the inlet 16; $P_2$ is a pressure of the carrier gas reaching to the flow resistors $12a$, $12b$, $12c$, $12d$, $12e$ and $12f$; $P_3$ is a pressure of the carrier gas flowing out of the flow resistors $12a$, $12b$, $12c$, $12d$, $12e$ and $12f$. $P_4$ is a pressure of a mixture (not shown) of the carrier gas and a vapor from a solid precursor to be delivered to a semiconductor fabrication process (not shown). The sizes of the pores in the porous material 14 are preferably substantially the same and more preferably around 1 micrometer or less. The sizes of the flow resistors $12a$, $12b$, $12c$, $12d$, $12e$ and $12f$ are preferably substantially the same and more preferable about 1 mm to about 1 cm in diameter or maximum diagonal length. This configuration will create a pressure drop when the carrier gas flows through the flow resistors. Thus, $P_2-P_3 \gg P_3-P_4$. Embodiments with the same sized pores of the porous material 14 and the same sized flow resistors $12a$, $12b$, $12c$, $12d$, $12e$ and $12f$, all gas distribution lines/streams formed by the flow resistors $12a$, $12b$, $12c$, $12d$, $12e$ and $12f$ will have the same pressure drops, and therefore will have the same gas flow rates out of $12a$, $12b$, $12c$, $12d$, $12e$, and $12f$. FIG. 2 is a diagram of gas flow and distribution lines of the disclosed vapor deliver systems or canisters. The flow of a carrier gas fed to the disclosed vapor delivery system is controlled by a mass flow controller (MFC) 20. The carrier gas is input into a metal tube having multiple flow resistors $22a$, $22b$, $22c$, $22d$, $22e$, $22f$ filled with a porous material as shown in FIG. 1. Six flow resistors are shown for demonstration. The multiple flow resistors may be any feasible quantity of flow resistors considering the pore size versus the size of the metal tube and the size of the hole in the metal tube. Here the flow resistors 22a, 22b, 22c, 22d, 22e, 22f are a result of the pores of the porous material, where a pressure drop generates and, in preferred cases with the same sized pores, each carrier gas stream flowing out of the flow resistors 22a, 22b, 22c, 22d, 22e, 22f have the same gas flow rates along gas distribution lines 24 in a gas distribution and vaporization zone in which the solid precursor material is vaporized. $P_1$ is a pressure of the carrier gas getting into an inlet of the canister; $P_{2a}$ is a pressure of the carrier gas reaching to flow resistor 22a; $P_{3a}$ is a pressure of the carrier gas flowing out of flow resistor 22a. Similarly but not shown, $P_{2b}$ is a pressure of the carrier gas reaching to flow resistor 22b; $P_{3b}$ is a pressure of the carrier gas flowing out of flow resistor 22b; and so on. $P_4$ is a pressure of a mixture of the carrier gas and the solid precursor vapor delivered to a semiconductor fabrication reactor. The disclosed vapor delivery systems or canisters, with the same pore size produce equal pressure drops, that is, $P_{2a}-P_{3a}=P_{2b}-P_{3b}=P_{2c}-P_{3c}$, etc., $P_{2a}-P_{3a}>>P_{3a}-P_4$, and $P_{2a}-P_{3a}>>P_1-P_{2a}$, thereby producing equal flow rate from each flow resistor. Other pressure drops in the gas flow path of the device are preferably insignificant comparing to the pressure drop of $P_2-P_3$ (i.e., $P_{2a}-P_{3a}$, $P_{2b}-P_{3b}$, and so on). Hereafter, the carrier gas passing through the flow resistors is mixed with the vapor of the solid precursor in the gas distribution and vaporization zone and the mixture of the carrier gas and the solid precursor vapor are collected and delivered to a semiconductor fabrication process. Hence, only one MFC is required to control the flow rate of all gas distribution lines in the disclosed solid vapor delivery system. Here the gas distribution lines refer to paths that the carrier gas flows in the gas distribution and vaporization zone once coming out of the flow resistors. Herein, the flow resistors are placed inside a vapor delivery canister as shown from the embodiments and figures that follow, but are not limited to. The flow resistors may be placed outside of the vapor delivery canister in some embodiments. The flow resistors may be placed in a housing lid or a system lid of the vapor delivery canister in some embodiments.

Figure 3:
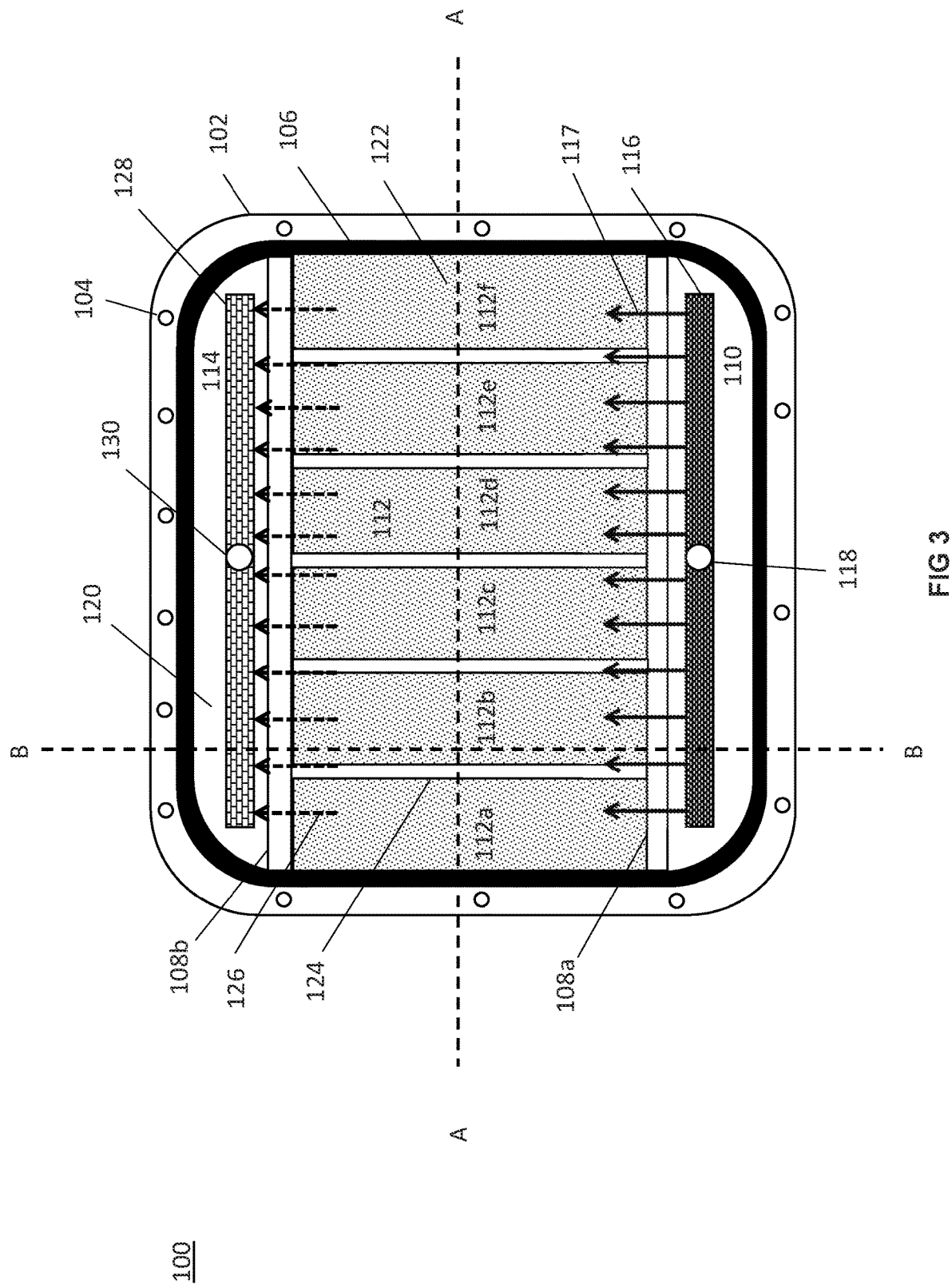
FIG. 3 is a block diagram of a top-view of an exemplary embodiment of a vapor delivery system body.
Figure 8:
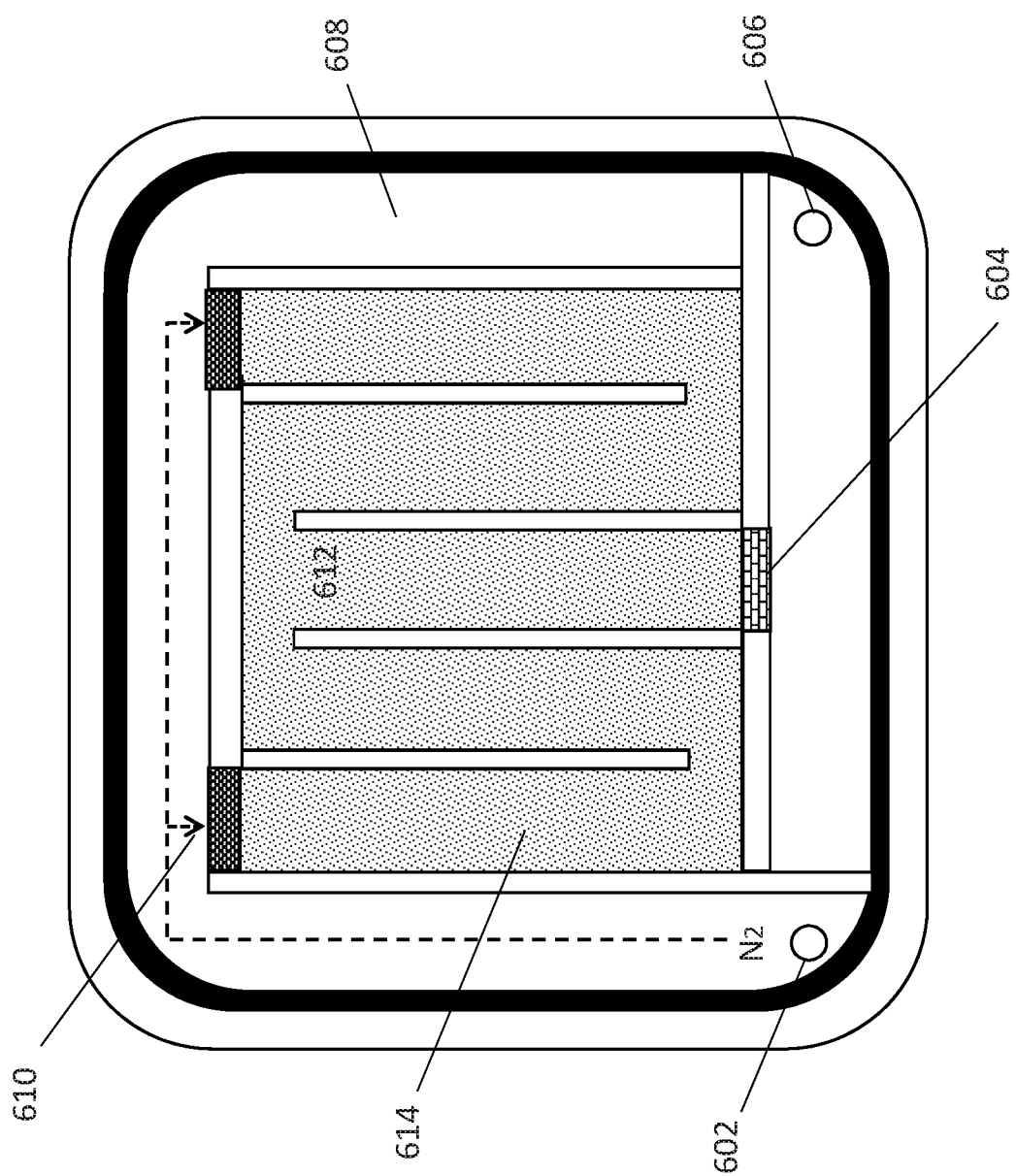
FIG. 8 is a block diagram of a top-view of another alternative exemplary embodiment of a vapor delivery system.
Figure 9:
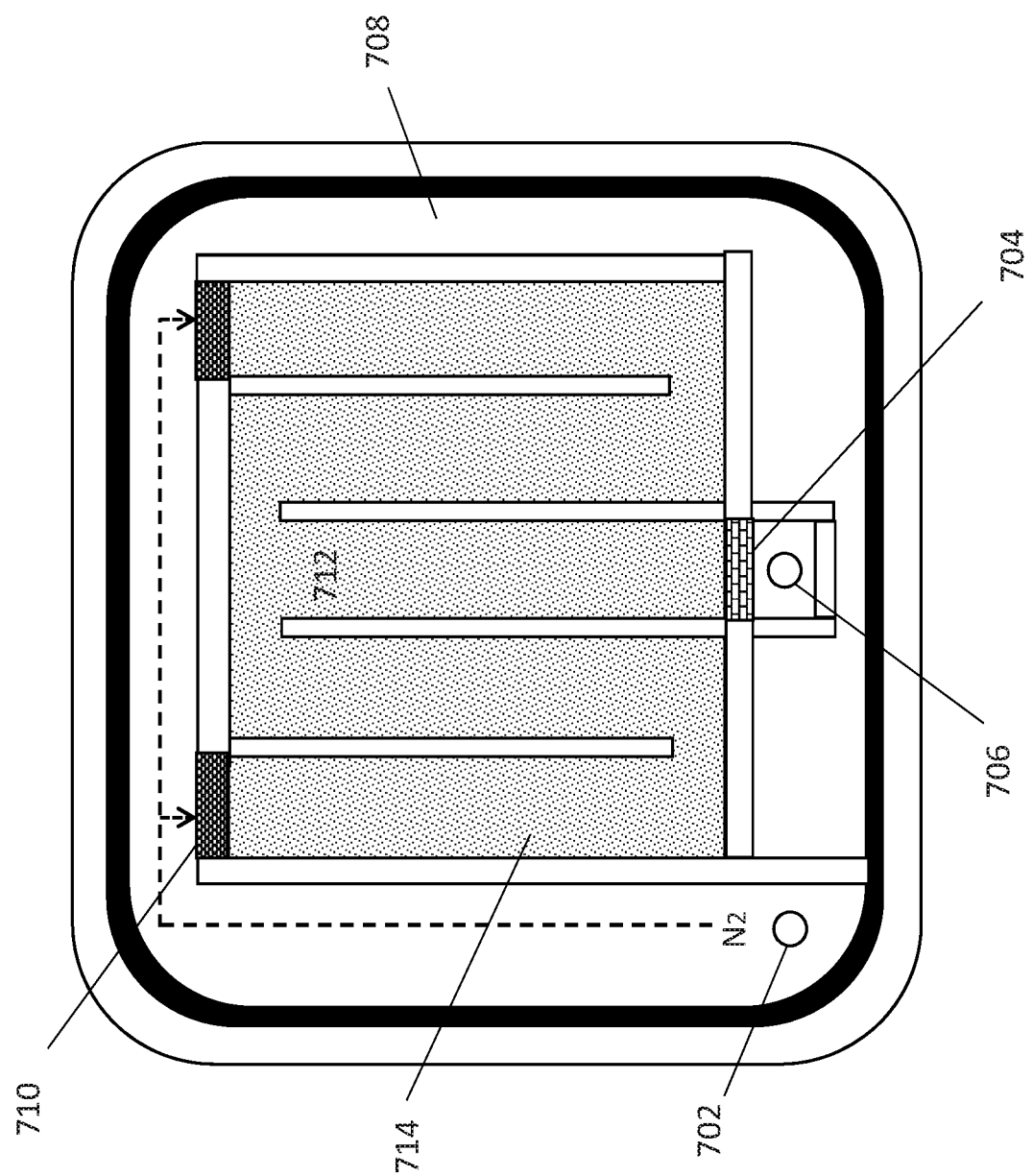
FIG. 9 is a block diagram of a top-view of another alternative exemplary embodiment of a vapor delivery system.
Figure 12:
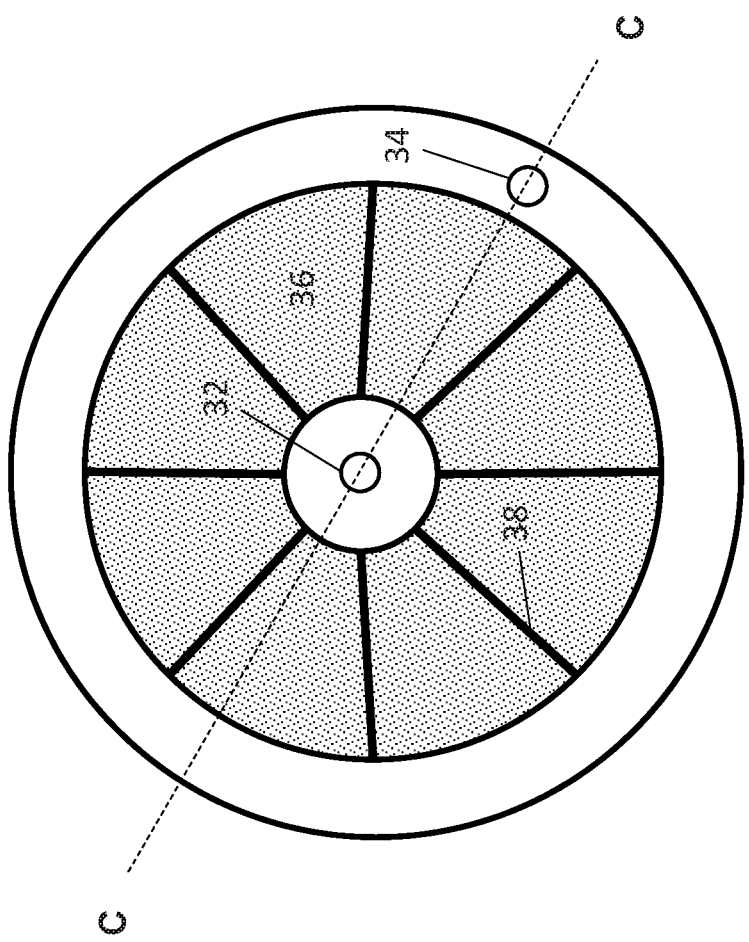
FIG. 12 is a block diagram of a top-view of an exemplary embodiment of a vapor delivery system body having multiple channels and multiple layers in a cylindrical shape.

FIG. 3 is a block diagram of a top-view of an exemplary embodiment of a vapor delivery system body for vaporization and delivery of solid precursors or solid source precursors for semiconductor fabrication processes. The exemplary embodiment of the vapor delivery system body may also be used to vaporize and deliver liquid precursors or liquid source precursors for semiconductor fabrication processes. The vapor delivery system may be in a canister shape or in a vessel shape and include the vapor delivery system body 100 and a vapor delivery system lid 200 referring to FIG. 4 below. As shown in FIG. 3, the system body 100 is enclosed with a housing 102 defining an interior volume 120 therein. The housing 102 may be made of stainless steel or the like. The system body 100 is fixed or screwed together with the system lid 200 through through-holes 104 in the housing 102 to form the vapor delivery system. A gasket or seal 106 is added in between the system body 100 and the system lid 200. The seal 106 will have no contact with the solid precursors or solid source precursors placed inside the vapor delivery system. In the interior volume 120, two inside walls 108a and 108b separate the interior volume 120 into three compartments. The two inside walls 108a and 108b each are fixed in the bottom of the interior volume 120 and the sidewall of the interior volume 120 and substantially perpendicular to the surface of the bottom of the interior volume and the sidewalls of the interior volume. The two inside walls 108a and 108b may be parallel to each other as shown in FIG. 3, but are not limited to. The two inside walls 108a and 108b may be flat walls. The two inside walls 108a and 108b may be curved walls in a cylindrical shaped canister as shown in FIG. 12. The number of the inside walls may be more two in the interior volume 120 that may be parallel and/or perpendicular to each other as shown in FIG. 8 and FIG. 9. The height of the two inside walls 108a and 108b is shorter than the height of the sidewall of the interior volume 120. The three resulting compartments include a first compartment 110, a second compartment 112 and a third compartment 114. Since the height of the two inside walls 108a and 108b is shorter than the sidewall of the interior volume 120, the top portions of the three compartments 110, 112 and 114 open into a common area forming a single continuous top compartment or zone.

The first compartment 110 is formed with one inside wall 108a, the bottom of the interior volume 120 and sidewalls of the interior volume 120. The first compartment 110 includes a porous metal device 116 mounted on a gas inlet tube 118, hanging in the first compartment 110, for feeding a carrier gas into the interior volume 120. Thus, one end of the gas inlet tube 118 is fluidically connected to the porous metal device 116 allowing the carrier gas to be injected into the interior volume 120 through the porous metal device 116, thereby forming multiple gas distribution lines therein. The porous metal device 116 includes flow resistors as shown in FIG. 1. The gas inlet tube 118 is installed in the system lid 200 shown in FIG. 4 below. Each pore in the porous metal device 116 forms a flow resistor through which the pressure of the carrier gas drops as the carrier gas passes therethrough, so that, preferably, a substantially even or identical flow of the carrier gas may be obtained along the multiple gas distribution lines 117 in the interior volume 120. The porous metal device 116 may be a metal tube, sphere, plate or the like, in which porous material fills the holes formed in the metal tube. The porous metal device 116, hanging in the first compartment 110, is fixed on the system lid 200 through the gas inlet tube 118, when the disclosed system is assembled. A carrier gas source may be fluidically connected to the gas inlet for feeding the carrier gas into the interior volume 120. The porous metal device 116 may be made of a metal or an alloy or the like. The pore size of the porous metal device 116 may vary depending on the requirements of the pressure drop. In one embodiment, the porous metal device 116 is made of stainless steel or other metals or alloys with an average pore size of 1 micrometer or less. Pores having small pore sizes create a larger pressure drop when gas flows through. Keeping the pores in the porous metal device 116 substantially the same size and shape, all gas distribution lines 117 will have approximately the same pressure drop, thereby having about the same gas flow rate. The carrier gas may be an inert gas, such as Ne, Ar, Kr, Xe or $N_2$, preferably $N_2$ or Ar. $N_2$ is taken as an example below. The carrier gas $N_2$ is input through the gas inlet tube 118 into the porous metal device 116 and flows out of the pores or flow resistor of the porous metal device 116 having a uniform distribution of $N_2$ flow along the gas distribution lines 117 in the interior volume 120, as described above. In this way, by adjusting the flow rate of the input $N_2$, the uniform, or nearly uniform, $N_2$ flows through the gas distribution lines 117 in the interior volume 120 is correspondingly changed. The flow rate of the input $N_2$ may be adjusted with a MFC as shown in FIG. 2. Therefore, by using one flow controller, a substantially uniformed distribution of $N_2$ flow in the interior volume 120 is obtained. The distribution of $N_2$ flow in the interior volume 120 will stabilize the vapor pressure of the vaporized solid in the interior volume 120 and in turn provide a constant vapor delivery during the course of the associated semiconductor fabrication process.

Once the carrier gas $N_2$ comes out of the porous metal device 116, the carrier gas $N_2$ then flows over the first inside wall 108a into the second compartment 112 through the top compartment. The second compartment 112 is formed within the two inside walls 108a, 108b, the bottom of the interior volume 120 and two sidewalls of the interior volume 120. Solid precursor material 122 is placed in the second compartment 112. The solid precursor 122 may be metal halides, metal oxyhalides, metal amides, metal carbonyls, metal chlorides, or the like. Here the metal may be selected from Al, Zr, Hf, Mo, W, etc. Dividers 124 separate the second compartment 112 into multiple parallel subcompartments or channels, for example, 112a, 112b, 112c, 112d, 112e, and 112f. Preferably, the dividers 124 separate the second compartment 112 into at least two parallel subcompartments or channels and possibly more than six such subcompartments. Each divider 124 is fixed between the two inside walls 108a, 108b and the bottom of the interior volume 120. In preferred embodiments, each end of the divider 124 is connected to the two inside walls 108a, 108b at a substantially 90° angle, respectively. The height of each divider 124 is higher than those of the two inside walls 108a, 108b so that each divider 124 is able to touch corresponding dividers 208 formed on the inner side of the system lid 200 referring to FIG. 4 below, once the system body 100 and the system lid 200 are assembled. In this way, in this preferred embodiment, the subcompartments or channels 112a, 112b, 112c, 112d, 112e and 112f are formed by the dividers 124 in a rectangle shape from the top view or a parallel linear shape. The subcompartments or channels 112a, 112b, 112c, 112d, 112e and 112f may be in a different shape from the top view, such as, a S-shape or a zig-zag shape, as long as the carrier gas $N_2$ flows through the top of the solid precursor material 122 along the channels and mixes with the vapor of the solid precursor material 122 to form a uniform mixed gas flow 126 in the top compartment. The divider 124 may instead insert into complementary grooves in the lid. Any configuration to create a substantially contiguous divider 124 from the lid to the bottom is acceptable. The aspect ratio of length versus diameter of each subcompartment/channel is approximately 10 to 1 ratio and the diameter (or maximum distance across) of each subcompartment/channel may range from ½" to 2" or even larger.

The carrier gas $N_2$ mixed with the vapor of the solid precursor material then flows over the second interior wall 108b into the third compartment 114. The third compartment 114 includes a gas-collecting device or a gas redistributing device 128 perpendicularly mounted on a gas outlet 130. Similar to the porous metal device 116 for producing the substantially uniformed distribution of $N_2$ to flow into the interior volume 120, the gas-collecting device 128 here collects the mixed gas flow 126 and delivers the mixed gas out of the vapor delivery system through the gas outlet 130 to a semiconductor process such as an application reactor. The gas outlet 130 is also installed in the system lid 200. The gas-collecting device 128 may also be in a tube, sphere or plate shape or the like. The gas-collecting device 128 may be in any shapes as long as the mixed gas is redistributed into the gas outlet tube 130. The gas-collecting device 128 may be made of metal or metal alloy having holes on it. The size of the holes in the gas-collecting device 128 may be in a range from millimeter to centimeter or the like. The gas-collecting device 128 may also be made of meshed material in which gas is able to flow through. The meshed material may have a mesh size ranging from millimeter to centimeter or the like. A filter (not shown) may be added outside of the gas-collecting device 128.

With this embodiment, the carrier gas $N_2$ may be uniformly distributed along the gas distribution lines 117 over the channels 112a-f in the interior volume 120 by using one flow controller, such as a MFC, to control the $N_2$ gas input in the gas inlet 118. No additional MFCs are required for forming uniform $N_2$ flow in the interior volume 120. The advantages of using one MFC are i) to generate substantially uniform $N_2$ flow rate along all of the gas distribution lines; and ii) to have the uniform flow rate of $N_2$ in all gas distribution lines be easily controlled and operated.

Since semiconductor application processes (e.g., deposition process) are normally operated under vacuum conditions or under a pressure lower than atmosphere pressure, the disclosed vapor delivery systems may be operated under vacuum conditions or under pressure lower than atmosphere pressure when the systems are applied to such semiconductor applications. This vacuum pull will enhance the flow of the carrier gas along the gas distribution lines or from the porous metal device 116 to the gas-collecting device 128.

Figure 4:
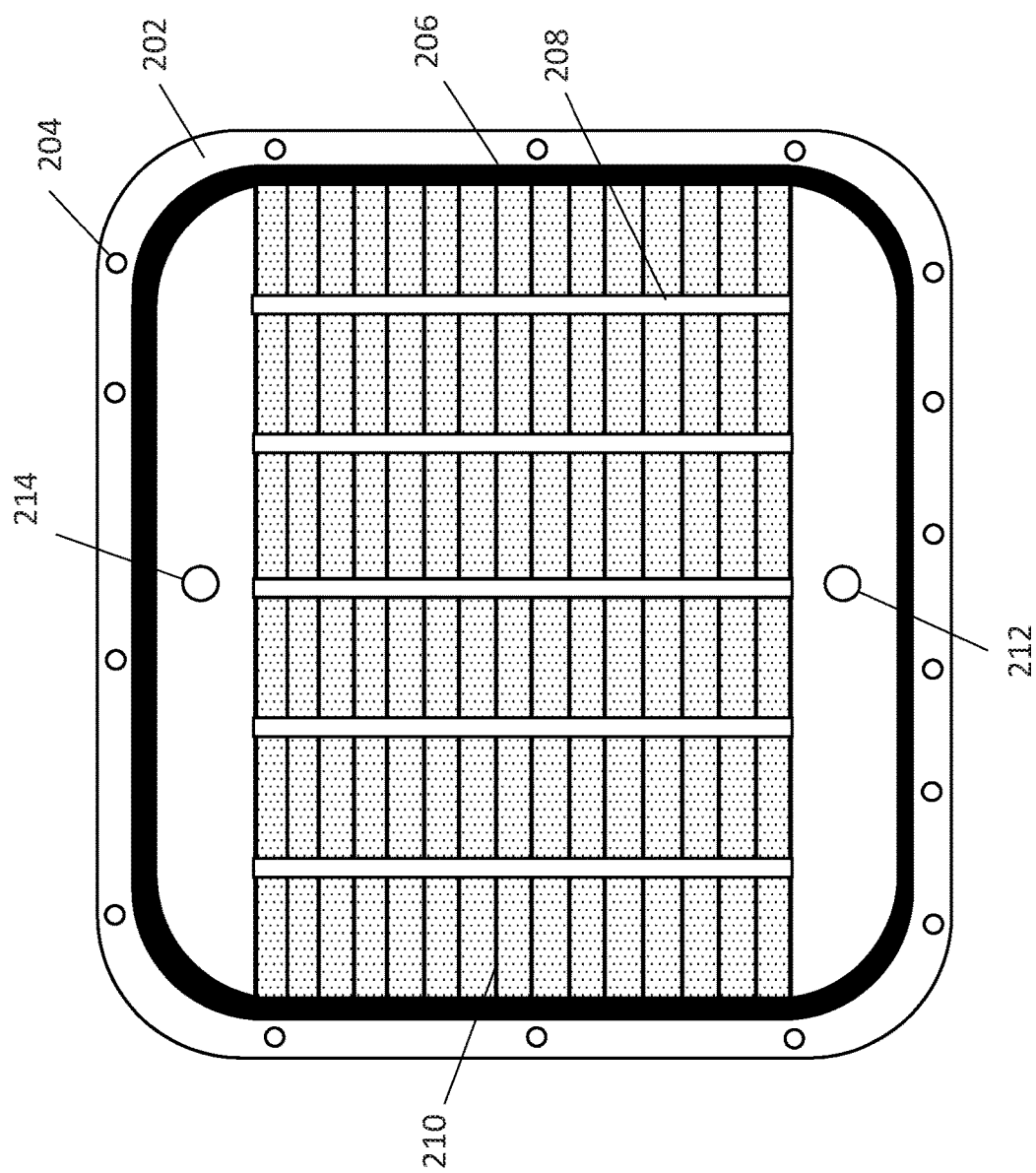
FIG. 4 is a block diagram of an inside out top-view of an exemplary embodiment of a vapor delivery system lid.

FIG. 4 is a block diagram of an inside out view of an exemplary embodiment of a vapor delivery system lid for vaporization and delivery of solid precursors or solid source precursors for semiconductor fabrication processes. The edge 202 of the system lid 200 includes a plurality of through-holes 204 that match the through-holes 104 shown in FIG. 3 for mounting the vapor delivery system body 100 with the vapor delivery system lid 200 together. Seal 206 is complementary to the seal 106 shown in FIG. 3. When mounting the system body 100 and the system lid 200 together, the seal 206 (or 106) preferably results in the vapor delivery system being sufficiently gas tight to limit or prevent gas leakage out or atmospheric infiltration in. The dividers 124 in the system body 100 shown in FIG. 3 have corresponding divider parts 208 in the system lid 200 each touch one divider 124 when the system lid 200 on the system body 100 are mounted together. Here, each set of divider 124 and divider part 208 may be sufficiently gas tight to limit or prevent gas leakage between or among the subcompartments 112a-f. Between the corresponding divider parts 208 are a plurality of baffles 210 that are configured to enhance gas flow turbulence for a better gas mixing of the carrier gas and the vapor from the solid precursor. Gas inlet hole 212 and gas outlet hole 214 are through-holes in the system lid 200, where the gas inlet 118 and the gas outlet 130 shown in FIG. 3 pass through and are mounted therein (preferably with a gas tight seal or fitting). The shape of the vapor delivery system is not limited to the shape demonstrated in FIG. 1 and FIG. 2. The shape of the vapor delivery system may be a cubic canister, a rectangular cubic canister, a cylindrical canister, or the like.

Figure 5:
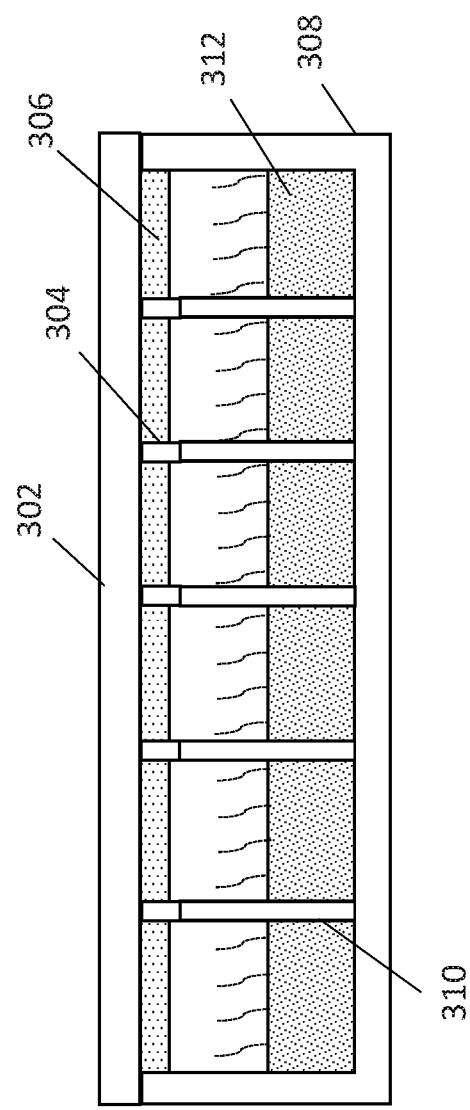
FIG. 5 is a block diagram of a cross-sectional view of an exemplary embodiment of a vapor delivery system along a line AA shown in FIG. 3.

FIG. 5 is a cross-sectional side view of an exemplary embodiment of a vapor delivery system along a line AA shown in FIG. 3. The system lid 302 and the system body 308 are mounted or tightened together. The system lid 302 includes corresponding divider parts 304 and baffles 306 mounted there on the inner side of the system lid 302. The system body 308 defines an interior volume that includes the dividers 310 and solid precursor material 312. The dividers 310 and the inside walls (not shown) separate the interior volume into subcompartments/channels each contain the solid precursor material 312. The corresponding divider parts 304 on the system lid 302 and the dividers 310 are contacted together once the system lid 302 and the system body 308 are mounted together. The connection of the corresponding divider parts 304 and the dividers 310 may or may not be gas tight.

Figure 6:
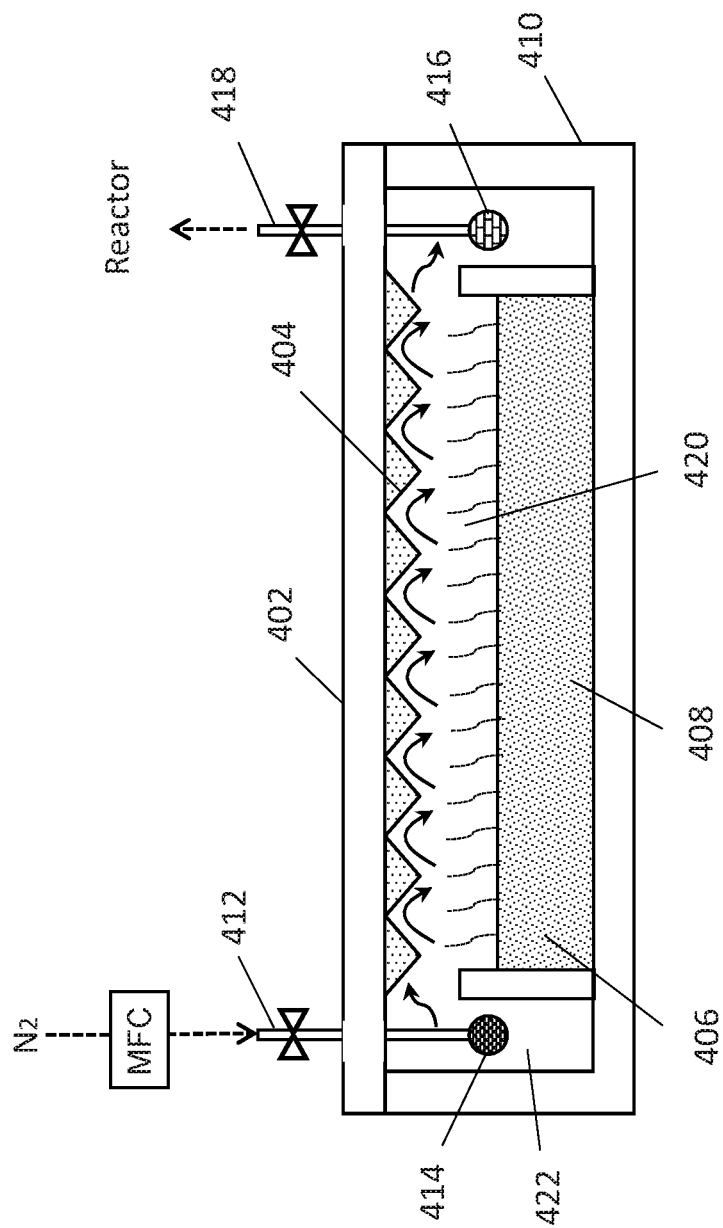
FIG. 6 is a block diagram of a cross-sectional view of an exemplary embodiment of a vapor delivery system along a line BB shown in FIG. 3.

FIG. 6 is a cross-sectional side view of an exemplary embodiment of a vapor delivery system along a line BB shown in FIG. 3. The system lid 402 and the system body 410 are mounted together. Attached to the inner side of the system lid 402 is a plurality of baffles 404 that is in a side-by-side triangle shape from the cross-sectional side view along the line BB shown in FIG. 3. The baffles 404, the surface of the solid precursor 408 and the inside walls (not shown) forms a top compartment 420 where the carrier gas $N_2$ flows through and carries the vapor of the solid precursor 408. The baffles 404 may create a turbulence of the carrier gas and the vapor of the solid precursor, making the carrier gas and the vapor of the solid precursor efficiently mixed. The baffles 404 each are in a strip-shape on the inner side of the system lid 402 from an inside out view perpendicular to the flow direction of the carrier gas or the gas distribution lines. The side view of the baffle 404 shown here is in the side-by-side triangle shape, but is not limited to. The side view of the baffle 404 may be in a side-by-side regular, equilateral or right triangle shape. The side view of the baffle 404 may be in any shapes that provide the turbulence for the carrier gas $N_2$, for example, a saw-tooth shape, a triangle to sine-wave shape, a side-by-side semi-circle shape, or the like. The carrier gas $N_2$ is input into the gas inlet tube 412 and then distributed into the interior volume 422 of the system with a substantially uniformed flow rate through the porous metal device 414 along gas distribution lines as described above. The carrier gas $N_2$ travels through the top compartment 420 of the interior volume 422. While encountering the solid precursor vapor, the carrier gas $N_2$ is mixed with the vapor of solid precursor. The mixture of the carrier gas $N_2$ and the vapor of the solid precursor then continues to flow and reaches to the third compartment as shown in FIG. 3, where a gas-collecting device 416 placed therein collects the mixture of the carrier gas $N_2$ and the vapor of the solid precursor and forwards the mixture into the gas outlet 418. In this way, the mixture of the carrier gas $N_2$ and the vapor of the solid precursor is delivered to (for example) a reactor of the semiconductor fabrication applications. The flow rate of the input carrier gas $N_2$ is controlled by a flow controller, such as a MFC, fluidically connected to a $N_2$ gas source outside of the system. By adjusting the flow rate of the input carrier gas $N_2$, the flow rate of the carrier gas $N_2$ distributed into the gas distribution lines by the porous metal device 414 in the interior volume 422 may be controlled. In this way, only one MFC that controls the flow of the input carrier gas $N_2$ is required, which is able to make the operation to obtain uniform flow rate of the carrier gas in the interior volume 422 accurately and efficiently.

The disclosed vapor delivery systems include various embodiments having different gas distribution lines.

Figure 7:
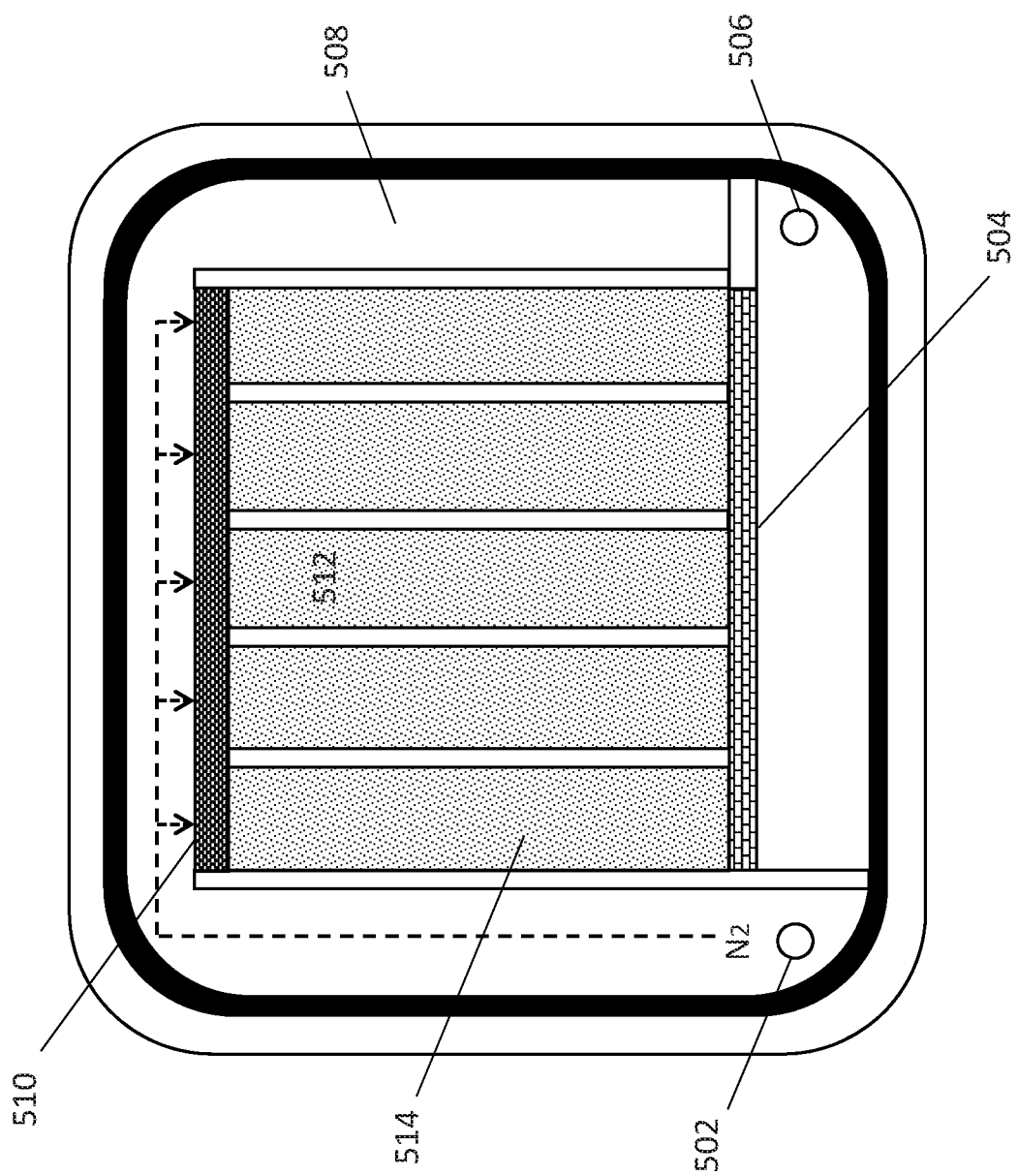
FIG. 7 is a block diagram of a top-view of an alternative exemplary embodiment of a vapor delivery system.

FIG. 7 is an alternative exemplary embodiment of the disclosed vapor delivery system having multiple channels. The carrier gas $N_2$ flows into the interior volume 508 of the system through gas inlet 502 and porous gas device 510 and then flows onto multiple parallel compartments 512 where a solid precursor material 514 is placed. The mixture of the carrier gas $N_2$ and the vapor of the solid precursor is then collected by the gas-collecting device 504 and flows out of the system through gas outlet 506.

FIG. 8 is another exemplary embodiment of the disclosed vapor delivery system having two channels. The carrier gas $N_2$ flows into the interior volume 608 of the system through the gas inlet 602 and the porous gas device 610 and then flows into multiple parallel compartments 612 where a solid precursor material 614 is placed. The mixture of the carrier gas $N_2$ and the solid precursor vapor is then directed by the gas-collecting device 604 and flows out of the system through gas outlet 606. In this embodiment, two S shape channels are included. More channels may be included if adding more porous gas devices 610 and more gas-collecting devices 604.

FIG. 9 is another exemplary embodiment of disclosed vapor delivery system having two channels. The carrier gas $N_2$ flows into the interior volume 708 of the system through the gas inlet 702 and porous gas device 710 and then flows into multiple parallel compartments 712 where a solid precursor material 714 is placed. The mixture of the carrier gas $N_2$ and the solid precursor vapor is then collected by the gas-collecting device 704 and flows out of the system through gas outlet 706. In this embodiment, two S shape channels are included. Similarly, more channels may be included if adding more porous gas devices 710 and more gas-collecting devices 704.

Figure 10:
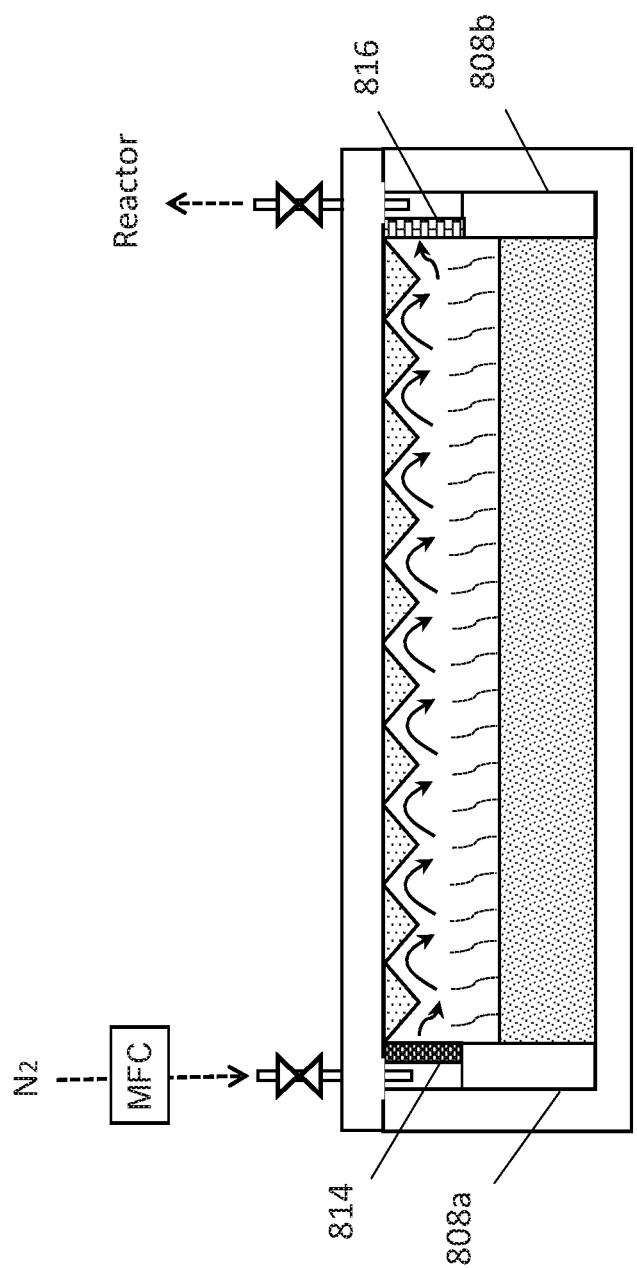
FIG. 10 is a block diagram of another exemplary embodiment of disclosed vapor delivery system having different configuration of the porous metal device in a cross-sectional view like FIG. 6.

FIG. 10 is another exemplary embodiment of disclosed vapor delivery system having different configuration of the porous metal device in a cross-sectional view like FIG. 6. The difference between FIG. 10 and FIG. 6 is that the porous metal device 414 in FIG. 6 is replaced with a porous metal device 814 and the gas-collecting device 416 is replaced with a gas-collecting device 816 in FIG. 10. The porous metal device 814 and the gas-collecting device 816 are plates used as a filter to have the carrier gas and vapor of the precursors flow through, but not the solid particles. The porous metal device 814 and the gas-collecting device 816 are placed on the top of two inside walls 808a and 808b, respectively. The porous metal device 814 produces gas distribution lines and the gas-collecting device 816 collects the mixture of the carrier gas and vapor of the solid precursor.

Figure 11:
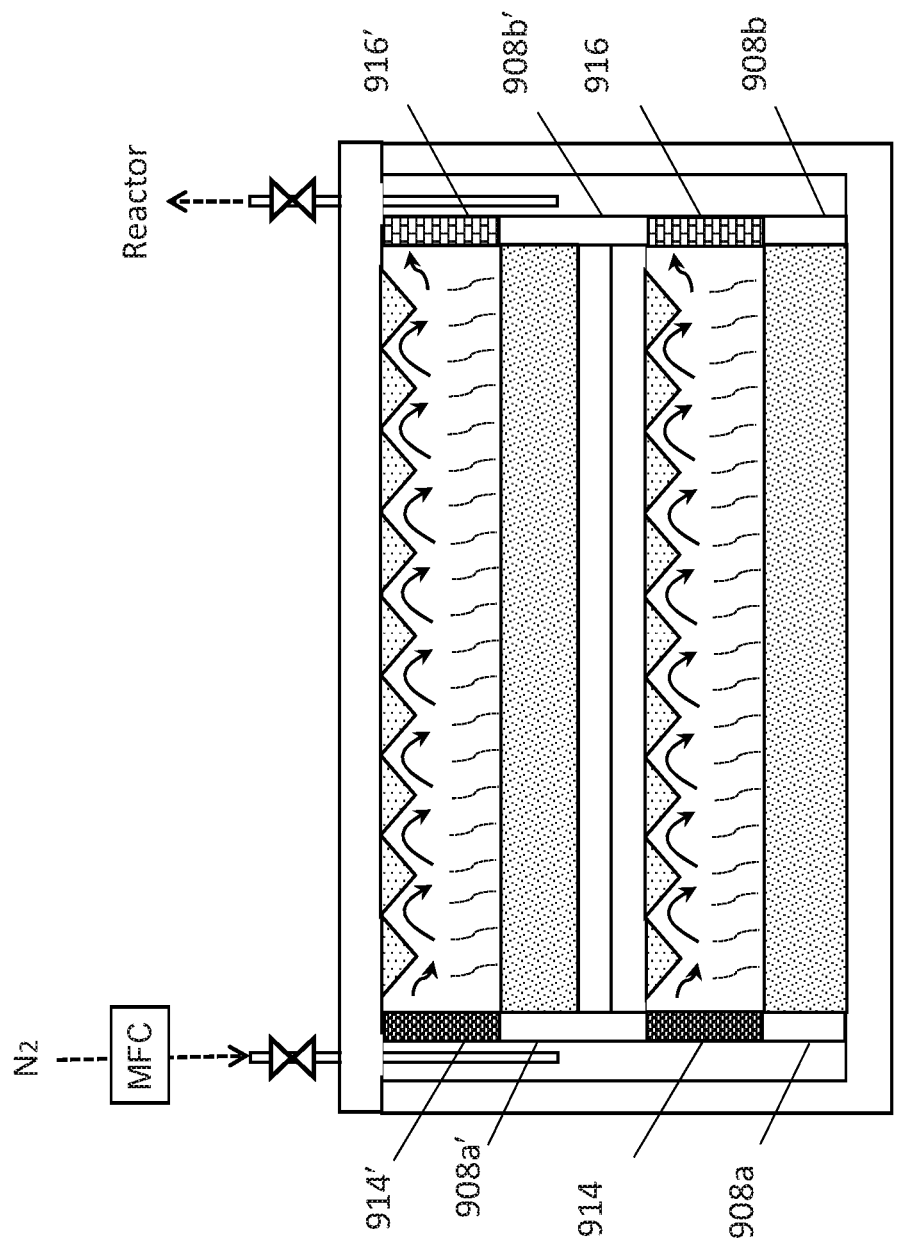
FIG. 11 is a diagram of is another exemplary embodiment of disclosed vapor delivery system having two layers of compartments/channels in a cross-sectional view like FIG. 6.

FIG. 11 is another exemplary embodiment of disclosed vapor delivery system having two layers of subcompartments/channels in a cross-sectional view like FIG. 6. The difference between FIG. 11 and FIG. 10 is a similar compartment shown in FIG. 10 is formed on the top of the other compartment shown in FIG. 11. The placements of the pore metal devices and the gas-collecting devices are similar to those shown in FIG. 10. The porous metal devices 914 and 914' are placed on the top of two inside walls 908a and 908a', respectively. The gas collecting devices 916 and 916' are placed on the top of the other two inside walls 908b and 908b', respectively. Similarly, the porous metal devices 914 and 914' produce gas distribution lines and the gas-collecting devices 916 and 916' collect the mixture of the carrier gas and the solid precursor vapor.

Figure 13:
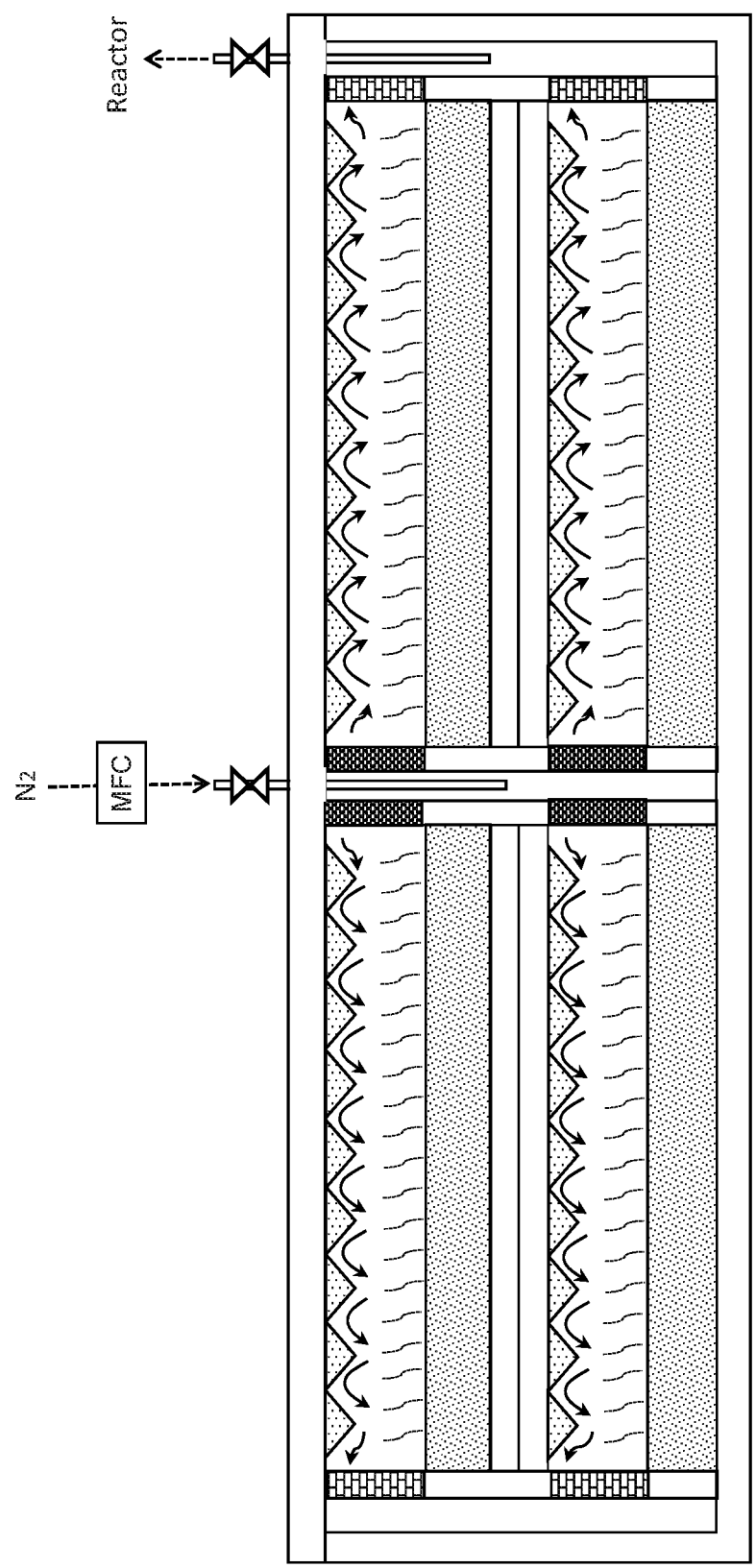
FIG. 13 is a block diagram of a cross-sectional view of an exemplary embodiment of the vapor delivery system body along a line CC shown in FIG. 11 having two layers of compartments/channels.

The shape of the disclosed vapor delivery system varies. The disclosed vapor delivery system may be in a cylindrical shape. As shown in FIG. 12 (the thickness of walls not shown), inlet 32 is in the hollow center axe of the cylindrical. Inside walls 38 divide an interior volume of the cylindrical into multiple channels where solid precursor materials 36 are placed therein. Outlet 34 is located between the interior volume and the outside wall of the cylindrical. The multiple channels may have at least two layers. FIG. 13 (the thickness of walls shown) is a block diagram of a cross-sectional view of an exemplary embodiment of the vapor delivery system body along a line CC shown in FIG. 12 having two layers of compartments/channels. FIG. 13 is a combination of FIG. 12 and its chiral symmetry.

The disclosed also includes the methods of using the vapor delivery systems applied to the ALD and/or CVD processes. The methods comprise the steps of placing the solid precursor in at least two compartments formed in the bottom portion of an interior volume defined by a housing, evaporating the solid precursor to form a vapor from the solid precursor, feeding a carrier gas into the interior volume through a porous metal device placed in the interior volume and fluidically connected to a gas inlet of the housing, wherein pores in the porous metal device produce gas distribution lines along which the carrier gas flows and mixes with the vapor from the solid precursor, adjusting a flow rate of the carrier gas fed to the gas inlet, so that a flow of the carrier gas flowing along each gas distribution line is controlled by the flow of the feed carrier gas and delivering the mixture of the carrier gas and the solid precursor vapor into a ALD and/or CVD process chamber through a gas-collecting device in the interior volume fluidically connected to a gas outlet of the housing.

The disclosed vapor delivery systems may be heated to enhance the solid precursors to be vaporized and to prevent condensation in the entire system. The disclosed vapor delivery systems may be maintained at room temperature or heated to a sublimation temperature of the solid precursor or higher for vaporizing the solid precursor.

The carrier gas may be an inert gas, for example, He, Ne, Ar, Kr, Xe, $N_2$. Preferably, the carrier gas is $N_2$ or Ar.

The orientation of the disclosed vapor delivery systems may be placed vertically with the lid on top or horizontally with the lid on side. In case of horizontally placed, the top of the compartments/channels need a plate to cover the compartments in order to prevent the solid material flowing out. Alternatively, the disclosed vapor delivery systems may be placed vertically to load the solid precursor material and placed horizontally to deliver the vapor to the application reactors. For a liquid precursor, the disclosed vapor delivery systems may be placed vertically to deliver the liquid vapor to the application reactors.

The advantages of the disclosed vapor delivery systems may include, but are not limited to, as follows. The disclosed vapor delivery systems provide multiple channels or at least two channels for vaporizing the solid precursors, no contacts and no bypass between channels and no clogs in each channel. Using the pore material as flow resistors, the disclosed vapor delivery systems may provide uniform high flux of gas flow.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A: X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The singular forms "a", "an" and "the" include plural referents, unless the context clearly dictates otherwise.

"About" or "around" or "approximately" in the text or in a claim means ±10% of the value stated.

As used herein, "room temperature" in the text or in a claim means from approximately 20° C. to approximately 25° C.

Note that herein, the terms "precursor" and "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

Note that herein, the terms "chamber" and "reactor" may be used interchangeably. It is understood that a chamber may correspond to, or related to a reactor, and that the reactor may refer to the chamber.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

Ranges may be expressed herein as from about one particular value, and/or to about another particular value. When such a range is expressed, it is to be understood that another embodiment is from the one particular value and/or to the other particular value, along with all combinations within said range.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A vapor delivery system for vaporizing a solid or liquid precursor, the system comprising:
a housing body defining an interior volume therein;
at least two inside walls in the interior volume configured to separate the interior volume into at least three sections including first, second and third sections, wherein the second section is adjacent to the first section and the third section and located in between the first section and the third section, wherein each inside wall is fixed on a bottom of the interior volume and sidewalls of the interior volume, and perpendicular to surfaces of the bottom and the sidewalls, wherein heights of the at least two inside walls are shorter than heights of the sidewalls of the interior volume, so that the at least three sections open into a common area forming a single continuous top compartment in a top portion of the interior volume through which a gas distribution lines pass;

a housing lid comprising a gas inlet and a gas outlet, a plurality of flow resistors, fluidically connected to the gas inlet, configured to receive a carrier gas from the gas inlet and generate gas distribution lines in the interior volume;

at least two compartments or channels, contained in a lower portion of the interior volume and having the solid or liquid precursor therein, the at least two compartments or channels configured to allow passage of the carrier gas thereover along the gas distribution lines to mix with a vapor from the solid or liquid precursor therein;

a gas collector downstream of the at least two compartments or channels, fluidically connected to the gas outlet in the housing lid, the gas collector configured to deliver a mixture of the carrier gas and the vapor from the solid or liquid precursor out of the system; and a flow controller fluidically connected to a carrier gas source, the flow controller being configured to control a feed flow rate of the carrier gas into the interior volume through the gas inlet, wherein a gas distribution flow rate of the carrier gas along each gas distribution line is controlled by the feed flow rate of the carrier gas feeding into the gas inlet.

2. The vapor delivery system of claim 1, further comprising baffles on an inner side of the housing lid, the baffles configured to create a turbulence to make the carrier gas and the vapor efficiently mixed, wherein the baffles are composed of strip-shaped bars on the inner side of the housing lid perpendicular to a flow direction of the carrier gas and a side view of the baffles is in a saw-tooth shape, a triangle shape, a sine wave shape, or a side-by-side semi-circle shape.

3. The vapor delivery system of claim 1, wherein the plurality of flow resistors and the gas collector are, respectively, disposed in the first section and the third section configured to receive the carrier gas from the gas inlet, generate the gas distribution lines in the interior volume and deliver the mixture of the carrier gas and the vapor from the solid or liquid precursor to the gas outlet.

4. The vapor delivery system of claim 1, further comprising dividers separating the second section into the at least two compartments or channels, wherein each divider is connected to the at least two inside walls and the bottom of the interior volume at a substantially 90° angle.

5. The vapor delivery system of claim 4, wherein a height of each divider is higher than the heights of the at least two inside walls so that each divider is configured to touch or engage with corresponding structures formed on an inner side of the housing lid when the housing body and the housing lid are assembled.

6. The vapor delivery system of claim 1, wherein the plurality of flow resistors are holes filled with a porous material.

7. The vapor delivery system of claim 6, wherein the porous material within the holes is further contained by a metal element selected from a metal tube, a metal sphere, or a metal plate.

8. The vapor delivery system of claim 7, wherein the plurality of flow resistors have an average size ranging from about 1 mm to about 1 cm.

9. The vapor delivery system of claim 7, wherein pores in the porous material have an average pore size of approximately 1 micrometer or less.

10. The vapor delivery system of claim 1, wherein a top view of the at least two compartments or channels is in a shape selected from a linear shape, an S-shape or a zigzag shape.

11. The vapor delivery system of claim 1, wherein the carrier gas is $N_2$, Ne, Ar, Kr or Xe.

12. The vapor delivery system of claim 1, wherein an aspect ratio of length versus diameter (or maximum distance across) of the at least two compartments or channels is approximately 10 to 1, wherein the diameter of each of the at least two compartments or channels ranges from ½" to 2" or larger.

* * * * *